(12) United States Patent
Ma et al.

(10) Patent No.: US 8,598,589 B2
(45) Date of Patent: Dec. 3, 2013

(54) ARRAY SUBSTRATE, METHOD OF MANUFACTURING THE ARRAY SUBSTRATE, AND DISPLAY APPARATUS INCLUDING THE ARRAY SUBSTRATE

(75) Inventors: Han-Na Ma, Yongin (KR); Jin-Suk Park, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/045,429

(22) Filed: Mar. 10, 2011

(65) Prior Publication Data

US 2012/0001191 A1  Jan. 5, 2012

(30) Foreign Application Priority Data

Jul. 1, 2010  (KR) .......................... 10-2010-0063430

(51) Int. Cl.
*H01L 33/08*  (2010.01)

(52) U.S. Cl.
USPC ................................. 257/71; 257/59; 257/83

(58) Field of Classification Search
USPC ............................. 257/71, E33.003, 59, 70, 83
See application file for complete search history.

(56) References Cited

U.S. PATENT DOCUMENTS

2007/0210353 A1* 9/2007 Nagata et al. ................. 257/288
2009/0059109 A1* 3/2009 Choi et al. ...................... 349/39

FOREIGN PATENT DOCUMENTS

| KR | 10-2005-0112645 A | 12/2005 |
| KR | 10-2006-0023420 A | 3/2006 |
| KR | 10-2008-0061183 A | 7/2008 |
| KR | 10-0865258 B1 | 10/2008 |
| KR | 10-2009-0038620 A | 4/2009 |

* cited by examiner

*Primary Examiner* — Tran Tran
(74) *Attorney, Agent, or Firm* — Knobbe, Martens, Olson & Bear LLP

(57) ABSTRACT

An array substrate is disclosed. In one embodiment, the substrate includes 1) a transistor area in which a transistor is formed, 2) a capacitor area in which a capacitor is formed, wherein the capacitor is electrically connected to the transistor and 3) a light transmittance area adjacent to at least one of the transistor area and the capacitor area. The substrate further includes 1) a first insulating layer formed in at least one of the transistor area and the capacitor area, wherein the first insulating layer is not formed in the light transmittance area and 2) a second insulating layer having i) a first portion arranged to substantially overlap with the first insulating layer in the at least one area, and ii) a second portion formed in the light transmittance area.

16 Claims, 13 Drawing Sheets

ARTIFICIAL LIGHT

ARRAY SUBSTRATE, METHOD OF MANUFACTURING THE ARRAY SUBSTRATE, AND DISPLAY APPARATUS INCLUDING THE ARRAY SUBSTRATE

CROSS-REFERENCE TO RELATED PATENT APPLICATION

This application claims the benefit of Korean Patent Application No. 10-2010-0063430, filed on Jul. 1, 2010, in the Korean Intellectual Property Office, the disclosure of which is incorporated herein in its entirety by reference.

BACKGROUND

1. Field

The described technology generally relates to an array substrate, a method of manufacturing the array substrate, and a display apparatus including the array substrate.

2. Description of the Related Technology

A liquid crystal display (LCD) generally includes i) an array substrate on which switching devices for driving pixels are formed, ii) an opposite substrate facing the array substrate, and iii) a liquid crystal layer formed between the array substrate and the opposite substrate. LCDs display an image by controlling transmittance of light by applying a voltage to the liquid crystal layer.

In order to support a charge retention capability of the liquid crystal layer, a storage capacitor is electrically connected in parallel with a liquid crystal capacitor in the LCD.

The storage capacitor and a thin-film transistor (TFT) are formed on the substrate. Generally, in a structure in which a silicon layer that is an active layer of a TFT is formed as an electrode of a storage capacitor, and a gate line is formed as another electrode of the storage capacitor, a gate-insulating layer corresponds to a dielectric layer of the storage capacitor.

In this structure in which the gate-insulating layer is used as the dielectric layer of the storage capacitor, the thickness of the gate-insulating layer may be made small so that the capacitance of the storage capacitor may be large. However, the structure is sensitive to static electricity.

SUMMARY

One inventive aspect is an array substrate in which the capacitance of a capacitor is large, and a characteristic of a thin-film transistor (TFT) and transmittance of a light transmittance area are increased, a method of manufacturing the array substrate, and a display apparatus including the array substrate.

Another aspect is an array substrate including a transistor area in which a transistor is formed; a capacitor area in which a capacitor is formed, wherein the capacitor is electrically connected to the transistor; a light transmittance area adjacent to at least one of the transistor area and the capacitor area; a first insulating layer formed in at least one of the transistor area and the capacitor area but not formed in the light transmittance area; and a second insulating layer having a first part arranged to overlap with the first insulating layer in the at least one of the transistor area and the capacitor area, and a second part arranged in the light transmittance area.

The first insulating layer may have a first hydrogen content, the second insulating layer may have a second hydrogen content that is less than the first hydrogen content, the first insulating layer may include a material having a first light transmittance, and the second insulating layer may include a material having a second light transmittance that is different from the first light transmittance.

The first light transmittance may be less than the second light transmittance.

The material of the first light transmittance, and the material of the second light transmittance may be silicon nitride and silicon oxide, respectively.

Hydrogen included in the first insulating layer may be supplied from a silane gas.

The first insulating layer may be arranged in the transistor area, at least one of an active layer and a gate electrode of the transistor may include polysilicon, and hydrogen that is comprised in the first insulating layer may fill a defect site of the polysilicon and then may solve the defect site.

The first insulating layer may be arranged in the capacitor area, at least one of electrodes of the capacitor may include polysilicon, and hydrogen that is comprised in the first insulating layer may fill a defect site of the polysilicon and then may solve the defect site.

The first insulating layer may be arranged in the capacitor area, and may be used as a dielectric layer of the capacitor.

The first insulating layer may have the same etched surface as at least one of electrodes of the capacitor.

The first insulating layer may be arranged in the capacitor area, and arranged on a gate electrode of the transistor.

The first part of the second insulating layer may be used as a gate-insulating layer of the transistor.

The first insulating layer may have the same etched surface as the gate electrode.

A third insulating layer may be formed on the first insulating layer, and the third insulating layer may include a second hydrogen content and a material having a second light transmittance that is the same as that of the second insulating layer.

The third insulating layer that is formed in the transistor area may be arranged between the first insulating layer and source and drain electrodes of the transistor, and the third insulating layer that is formed in the capacitor area may be arranged on the capacitor.

The array substrate may further include a transparent electrode connected to one of source and drain electrodes of the transistor, and formed in the light transmittance area.

A third insulating layer may be formed on the second insulating layer.

An organic insulating layer may be formed between the transparent electrode and the source and drain electrodes of the transistor.

The organic insulating layer may not be formed in the light transmittance area.

Another aspect is an array substrate including a transistor area in which a transistor is formed; a capacitor area in which a capacitor is formed, wherein the capacitor is electrically connected to the transistor; a light transmittance area adjacent to at least one of the transistor area and the capacitor area; a first insulating layer formed in at least one of the transistor area and the capacitor area but not formed in the light transmittance area; a second insulating layer having a first part arranged to overlap with the first insulating layer in the at least one of the transistor area and the capacitor area, and a second part arranged in the light transmittance area; a transparent electrode connected to one of source and drain electrodes of the transistor, and formed in the light transmittance area; a common electrode facing the transparent electrode; and a light-emitting device arranged between the transparent electrode and common electrode.

The first insulating layer may have a first hydrogen content, the second insulating layer may have a second hydrogen content that is less than the first hydrogen content, the first insulating layer may include a material having a first light transmittance, and the second insulating layer may include a material having a second light transmittance that is different from the first light transmittance, and the light-emitting device comprises liquid crystal.

Another aspect is a method of manufacturing an array substrate, the method including the operations of forming a semiconductor layer on a base substrate, and forming a second insulating layer so as to cover the semiconductor layer; simultaneously forming a gate electrode and a capacitor first electrode on the second insulating layer by using the same material; forming a first insulating layer on the second insulating layer so as to cover the gate electrode and the capacitor first electrode, and then forming a metal layer on the first insulating layer; patterning the first insulating layer and the metal layer, and then forming a capacitor second electrode by using the metal layer so as to correspond to the capacitor first electrode and removing the first insulating layer from a light transmittance area so as to prevent the first insulating layer from being formed in the light transmittance area in which a thin-film transistor (TFT) and a capacitor are not arranged; and forming source and drain electrodes connected to the semiconductor layer.

The operation of patterning may be performed by using a half-tone mask comprising an opaque part corresponding to the capacitor, a transflective part corresponding to the TFT, and a transmissive part corresponding to the light transmittance area.

The operations of patterning, and then forming and removing may include the operations of forming the capacitor second electrode by using a mask comprising an opaque part corresponding to the capacitor, and a transmissive part corresponding to the TFT and the light transmittance area; and forming a photoresist on the capacitor second electrode, and performing back exposure from the base substrate toward the photoresist, whereby the first insulating layer is removed from the light transmittance area and thus is not formed in the light transmittance area.

The operation of forming the source and drain electrodes may include the operation of forming a third insulating layer so as to cover the first insulating layer and the capacitor second electrode on the second insulating layer.

An annealing process may be performed after the forming of the third insulating layer.

After the operation of forming the source and drain electrodes, the method may further include the operation of forming source and drain electrodes on the third insulating layer so as to be connected to the semiconductor layer and the capacitor second electrode.

The annealing process may be performed after the operation of forming the source and drain electrodes.

Another aspect is an array substrate comprising: a transistor area in which a transistor is formed; a capacitor area in which a capacitor is formed, wherein the capacitor is electrically connected to the transistor; a light transmittance area adjacent to at least one of the transistor area and the capacitor area; a first insulating layer formed in at least one of the transistor area and the capacitor area, wherein the first insulating layer is not formed in the light transmittance area; and a second insulating layer having i) a first portion arranged to substantially overlap with the first insulating layer in the at least one area, and ii) a second portion formed in the light transmittance area.

In the above substrate, the first insulating layer has a first amount of hydrogen, and the second insulating layer has a second amount of hydrogen that is less than the first amount, wherein the first insulating layer comprises a first material having a first light transmittance, and wherein the second insulating layer comprises a second material having a second light transmittance that is different from the first light transmittance.

In the above substrate, the first light transmittance is less than the second light transmittance. In the above substrate, the first material is formed at least partially of silicon nitride, and wherein the second material is formed at least partially of silicon oxide. In the above substrate, the first insulating layer contains hydrogen. In the above substrate, the first insulating layer is formed at least in the transistor area, wherein at least one of an active layer and a gate electrode of the transistor comprises polysilicon, and wherein the hydrogen contained in the first insulating layer is configured to fill a defective region of the polysilicon.

In the above substrate, the first insulating layer is formed at least in the capacitor area, wherein at least one of electrodes of the capacitor comprises polysilicon, and wherein the hydrogen contained in the first insulating layer is configured to fill a defective region of the polysilicon. The above substrate further comprises a third insulating layer formed on the first insulating layer, wherein the third insulating layer comprises the second amount of hydrogen and the second material. In the above substrate, the third insulating layer comprises i) a first portion formed between the first insulating layer and source and drain electrodes of the transistor and ii) a second portion formed on the capacitor. In the above substrate, the first insulating layer is formed at least in the capacitor area, and is used as a dielectric layer of the capacitor.

In the above substrate, the first insulating layer has substantially the same etched surface as at least one of electrodes of the capacitor. In the above substrate, the first insulating layer is formed between lower and upper electrodes of the capacitor, and formed on a gate electrode of the transistor. In the above substrate, the first portion of the second insulating layer is used as a gate-insulating layer of the transistor.

In the above substrate, the first insulating layer has substantially the same etched surface as the gate electrode. The above substrate further comprises a transparent electrode electrically connected to one of source and drain electrodes of the transistor, and formed in the light transmittance area. The above substrate further comprises a third insulating layer formed on the second insulating layer. The above substrate further comprises an organic insulating layer formed between the transparent electrode and the source and drain electrodes of the transistor. In the above substrate, the organic insulating layer is not formed in the light transmittance area.

Another aspect is an array substrate comprising: a non-light transmittance area in which a capacitor and a transistor, electrically connected to each other, are formed; a light transmittance area adjacent to the non-light transmittance area; a first insulating layer formed only in the non-light transmittance area; a second insulating layer having a first portion arranged to substantially overlap with the first insulating layer, and a second portion formed in the light transmittance area; a transparent electrode electrically connected to one of source and drain electrodes of the transistor, and formed in the light transmittance area; a common electrode facing the transparent electrode; and a light-emitting device formed between the transparent electrode and common electrode.

In the above substrate, the first insulating layer has a first amount of hydrogen, and the second insulating layer has a second amount of hydrogen that is less than the first amount, wherein the first insulating layer comprises a material having a first light transmittance, and the second insulating layer comprises a material having a second light transmittance that is different from the first light transmittance, and wherein the light-emitting device comprises liquid crystal.

Another aspect is a method of manufacturing an array substrate, the method comprising: forming a semiconductor layer on a base substrate, and forming a second insulating layer so as to cover the semiconductor layer; substantially simultaneously forming a gate electrode and a first capacitor electrode on the second insulating layer from the same material; forming a first insulating layer on the second insulating layer so as to cover the gate electrode and the first capacitor electrode; forming a metal layer on the first insulating layer; patterning the first insulating layer and the metal layer; forming a second capacitor electrode, from the metal layer, to be substantially directly above the first capacitor electrode; removing a portion of the first insulating layer from a light transmittance area so that the first insulating layer is not formed in the light transmittance area, wherein a thin-film transistor (TFT) and a capacitor are not formed in the light transmittance area; and forming source and drain electrodes over the semiconductor layer.

In the above method, the patterning is performed by using a half-tone mask having i) an opaque portion formed substantially directly above the capacitor, ii) a transflective portion formed substantially directly above the TFT, and iii) a transmissive portion formed substantially directly above the light transmittance area. In the above method, the second capacitor electrode is formed by using a mask having i) an opaque portion formed substantially directly above the capacitor, and ii) a transmissive portion formed substantially directly above the TFT and the light transmittance area; and wherein the first insulating layer is removed from the light transmittance area by i) forming a photoresist on the second capacitor electrode, and ii) performing back exposure from the base substrate toward the photoresist.

The above method further comprises, before forming the source and drain electrodes, forming a third insulating layer so as to cover the first insulating layer and the second capacitor electrode on the second insulating layer. The above method further comprises performing an annealing process after forming the third insulating layer. The above method further comprises electrically connecting the source and drain electrodes to the semiconductor layer and the second capacitor electrode. In the above method, the annealing process is performed after forming the source and drain electrodes.

DETAILED DESCRIPTION

Hereinafter, embodiments will be described in detail with reference to the attached drawings.

Figure 1:
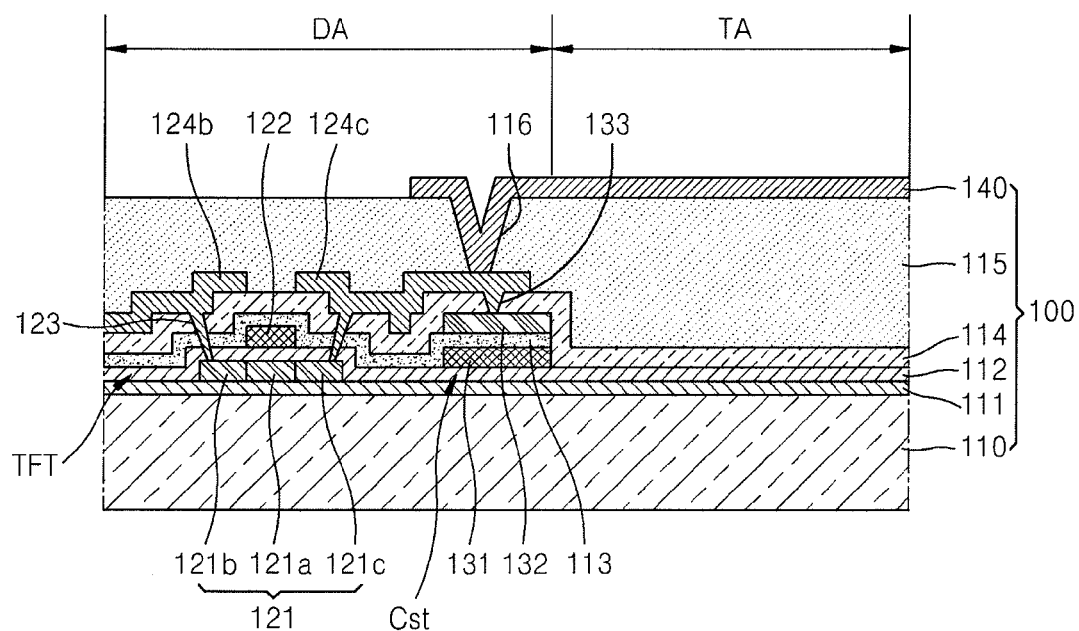
FIG. 1 is a cross-sectional view of an array substrate according to an embodiment.

FIG. 1 is a cross-sectional view of an array substrate 100 according to an embodiment. FIGS. 2 through 11 are cross-sectional views for illustrating a procedure for manufacturing the array substrate 100.

Referring to FIG. 1, the array substrate 100 includes a device area DA (or a non-light transmittance area) including a transistor area and a capacitor area in which a thin-film transistor (TFT) and a capacitor Cst are formed respectively, and a light transmittance area TA in which a transparent electrode 140 is formed. In one embodiment, the light transmittance area TA is formed adjacent to one of the transistor area and capacitor area. In another embodiment, the light transmittance area TA is formed adjacent to both of the transistor area and capacitor area. In this embodiment, the light transmittance area TA is formed between the transistor area and capacitor area (not shown).

The TFT includes a semiconductor layer 121 including a channel region 121a, a source region 121b, and a drain region 121c on a base substrate 110. Here, the semiconductor layer 121 may be formed at least partially of polysilicon. The TFT includes a gate electrode 122 that corresponds to the channel region 121a, with a second insulating layer 112 functioning as a gate-insulating layer interposed therebetween. Here, the gate electrode 122 may be formed at least partially of polysilicon. The TFT includes a source electrode 124b and a drain electrode 124c that are electrically connected to the source region 121b and the drain region 121c, respectively, via a first contact hole 123, with a first insulating layer 113 and a third insulating layer 114 interposed therebetween. In one embodiment, the first insulating layer 113 and the third insulating layer 114 function as a first interlayer insulating layer and a second interlayer insulating layer, respectively.

Meanwhile, a buffer layer 111 may be further formed on the base substrate 110 so as to prevent impurity from penetrating into the base substrate 110 and so that a top surface of the base substrate 110 is substantially flat.

The TFT of the array substrate 100 includes a plurality of insulating layers such as the second insulating layer 112, the first insulating layer 113, and the third insulating layer 114. In one embodiment, the first insulating layer 113 on which the gate electrode 122 is formed has a higher hydrogen content than the second insulating layer 112 and the third insulating layer 114. For example, the first insulating layer 113 may be formed at least partially of silicon nitride, and the second insulating layer 112 and the third insulating layer 114 may be formed at least partially of silicon oxide.

When a gate voltage is regularly applied to the TFT of the array substrate 100, current between the source electrode 124b and the drain electrode 124c, which has passed through the channel region 121a of the semiconductor layer 121, is increased. In one embodiment, the increased current substantially fills, a defective region of the semiconductor layer 121 formed at least partially of polysilicon, with hydrogen, wherein the hydrogen is supplied from a silane gas while the first insulating layer 113 is formed at least partially of silicon nitride, so that electron mobility of the TFT is increased.

The TFT having silicon nitride with a high hydrogen content formed on the gate electrode 122 has improved characteristics, compared to a TFT having only silicon oxide formed on the gate electrode 122.

In the present embodiment, the capacitor Cst of the array substrate 100 is patterned on the base substrate 110 and is separated from the TFT. The capacitor Cst includes a first capacitor electrode 131 formed of the same material and on the same layer as the gate electrode 122 of the TFT, and a second capacitor electrode 132 formed at a position corresponding to the first capacitor electrode 131, with the third insulating layer 114 interposed therebetween. The second capacitor electrode 132 is electrically connected to the drain electrode 124c of the TFT via a second contact hole 133 formed through the third insulating layer 114 interposed therebetween.

The capacitor Cst of the array substrate 100 uses silicon nitride, which is used to form the first insulating layer 113 of the TFT, as a dielectric layer so that the capacitance of the capacitor Cst may be increased, compared to a capacitor using a gate-insulating layer of a TFT as a dielectric layer. That is, according to the present embodiment, by using silicon nitride having a larger dielectric constant than silicon oxide, the capacitance of the capacitor Cst may be increased. Also, according to the present embodiment, it is possible to prevent a static electricity problem caused when a thickness of the dielectric layer is reduced to increase the capacitance of the capacitor that uses silicon oxide as the dielectric layer.

In a case where the gate electrode 122 includes polysilicon, the first capacitor electrode 131 may also be formed at least partially of polysilicon. In one embodiment, hydrogen substantially fills, a defective region of the first capacitor electrode 131 formed at least partially of polysilicon, wherein the hydrogen is supplied from a silane gas while the dielectric layer is formed at least partially of silicon nitride, so that a defect of the capacitor Cst may be solved.

The light transmittance area TA includes a plurality of insulating layers, namely, the buffer layer 111, the second insulating layer 112, the third insulating layer 114, and an organic insulating layer 115 formed on the base substrate 110, and the transparent electrode 140 formed on the plurality of insulating layers. Here, the transparent electrode 140 is electrically connected to the drain electrode 124c of the TFT, with the organic insulating layer 115 interposed therebetween.

The light transmittance area TA arranged in the array substrate 100 may be used as a light-transmitting window allowing external light to pass therethrough in a display apparatus such as a liquid crystal display (LCD) to be described later. For this, all components formed in the light transmittance area TA may be configured to transmit external light.

Thus, the base substrate 110 and the transparent electrode 140 are formed at least partially of a transparent material.

In one embodiment, the buffer layer 111, the second insulating layer 112, the third insulating layer 114, and the organic insulating layer 115 formed between the base substrate 110 and the transparent electrode 140 have a thickness appropriate for transmitting external light.

In one embodiment, the buffer layer 111, the second insulating layer 112, and the third insulating layer 114 are formed at least partially of an inorganic material. In this embodiment, the inorganic layers 111, 112 and 114 are formed of materials having the same light transmittance and including silicon oxide, so that it is possible to prevent transmittance deterioration due to a difference between refractive indexes of the inorganic insulating layers. In particular, according to the present embodiment, the first insulating layer 113, which is formed in the device area DA including the TFT and the capacitor Cst, is not formed in the light transmittance area TA. That is, silicon nitride having smaller light transmittance than that of silicon oxide is not formed in the light transmittance area TA, so that it is possible to prevent the transmittance deterioration due to the difference between the refractive indexes in the light transmittance area TA.

The organic insulating layer 115 included in the light transmittance area TA may be formed at least partially of a transparent material so as to support the light transmittance area TA in functioning as the light-transmitting window. However, a material forming the organic insulating layer 115 is not limited thereto.

Figure 12:
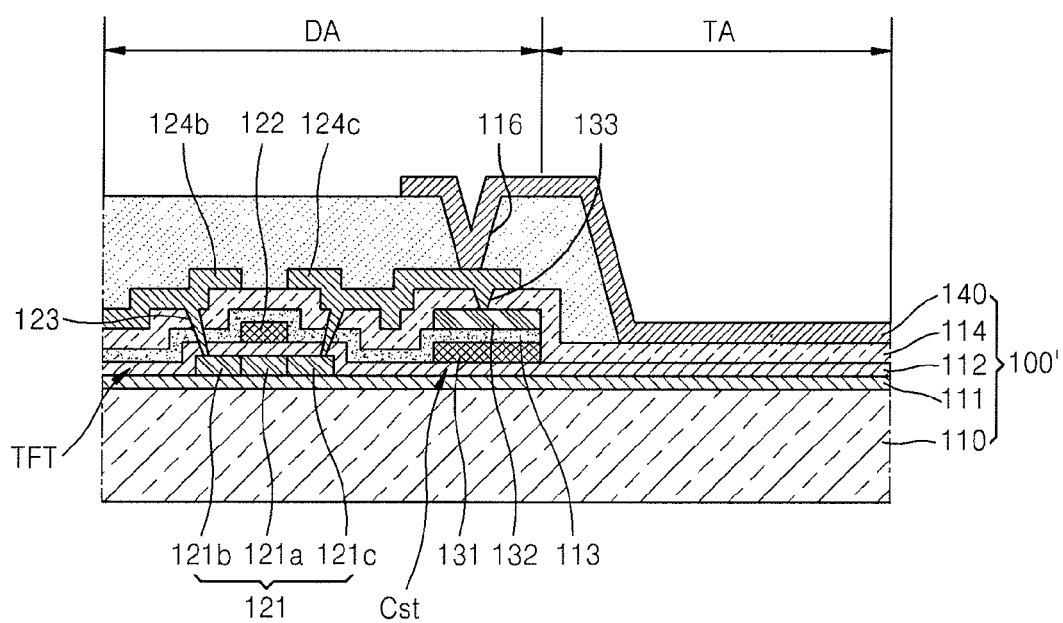
FIG. 12 is a cross-sectional view of an array substrate according to another embodiment.

Referring to FIG. 12, the array substrate 100' according to one embodiment does not include the organic insulating layer 115 in the light transmittance area TA. In this case, it is not necessary to form the organic insulating layer 115 by using a transparent material. Thus, according to the array substrate 100' of FIG. 12, light transmittance of the light transmittance area TA may be increased by omitting the organic insulating layer 115 in the light transmittance area TA.

Hereinafter, a method of manufacturing the array substrate 100 of FIG. 1 will be described with reference to FIGS. 2 through 11.

Figure 2:
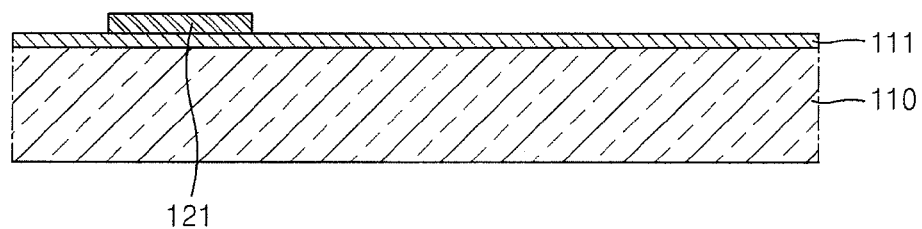
FIGS. 2 through 11 are cross-sectional views for illustrating a procedure for manufacturing the array substrate of FIG. 1.

Referring to FIG. 2, a buffer layer 111 is formed on a base substrate 110, and a semiconductor layer 121 is patterned on the buffer layer 111 according to a predetermined pattern.

As described above, the base substrate 110 is formed as a transparent substrate. The buffer layer 111 may be formed by depositing silicon oxide with the use of one of various depositing methods including chemical vapor deposition (CVD). The semiconductor layer 121 may be formed by patterning amorphous silicon or polysilicon via, for example, a photolithography method.

Figure 3:
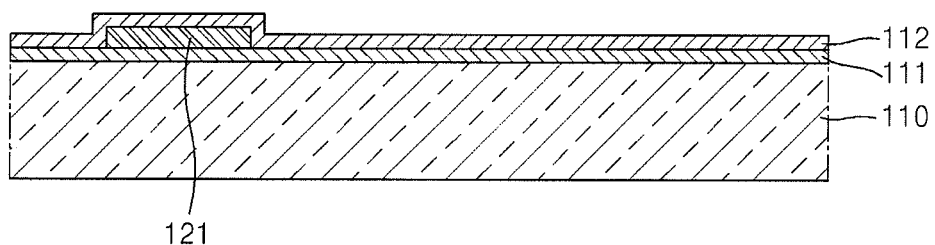

Referring to FIG. 3, a second insulating layer 112 is formed to cover the semiconductor layer 121 on the buffer layer 111. Like the buffer layer 111, the second insulating layer 112 may be formed at least partially of silicon oxide.

Figure 4:
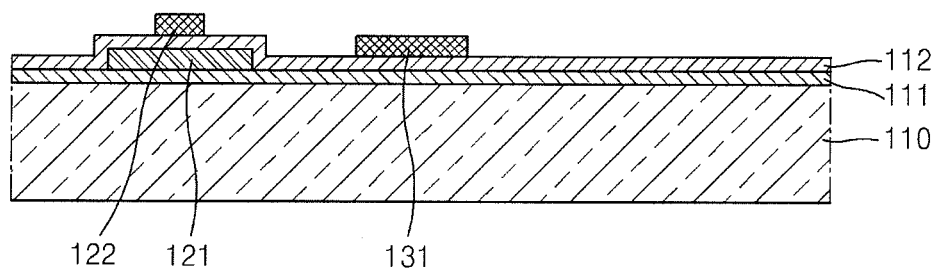

Referring to FIG. 4, a gate electrode 122 and the first capacitor electrode 131 are formed on the second insulating layer 112. The gate electrode 122 and the first capacitor electrode 131 are substantially simultaneously formed of the same material and patterned on the same layer.

Figure 5:
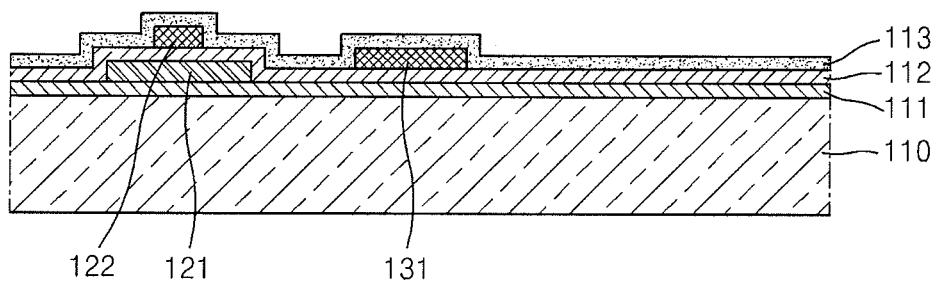

Referring to FIG. 5, a first insulating layer 113 is formed to at least partially cover the gate electrode 122 and the first capacitor electrode 131 on the second insulating layer 112. In one embodiment, the first insulating layer 113 is formed at least partially of silicon nitride in a hydrogen atmosphere by using one of various depositing methods including CVD.

Figure 6:
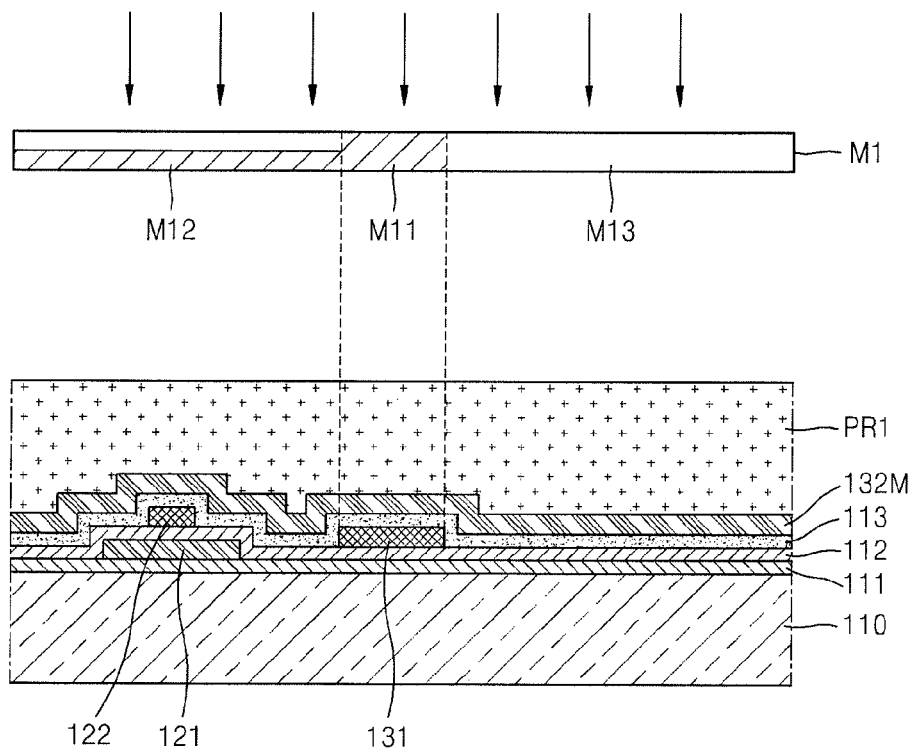

Referring to FIG. 6, a metal layer 132M is stacked on the first insulating layer 113, and a photoresist PR1 is coated thereon and then are exposed by using a photomask M1.

The photomask M1 is a half-tone mask including an opaque portion M11, a transflective portion M12, and a transmissive portion M13. The opaque portion M11 is formed to correspond to or substantially directly above a capacitor Cst, the transflective portion M12 is formed to correspond to or substantially directly above a TFT, and the transmissive portion M13 is formed to a light transmittance area TA.

Figure 7:
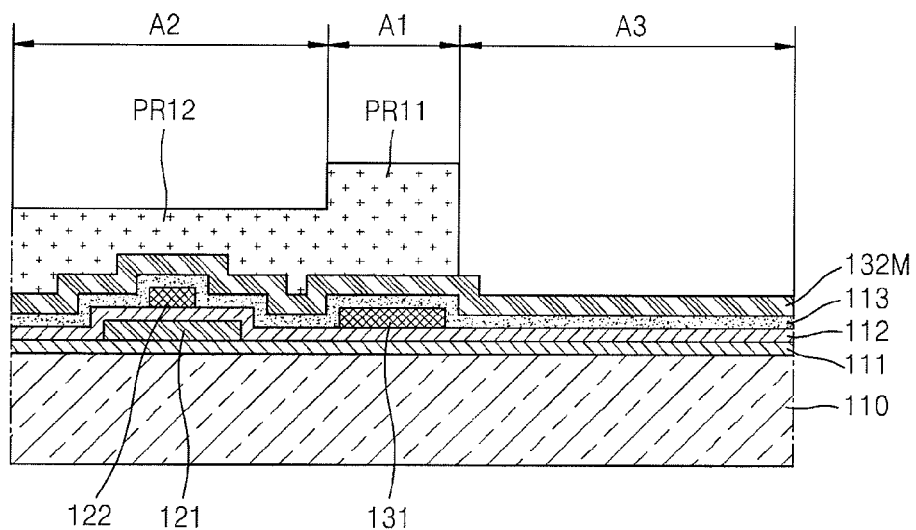

Referring to FIG. 7, the photoresist PR11 of an area A1 corresponding to the opaque portion M11 remains relatively thick compared to a photoresist PR12 of an area A2 corresponding to the transflective portion M12, and a photoresist of an area A3 corresponding to the transmissive portion M13 is removed.

Figure 8:
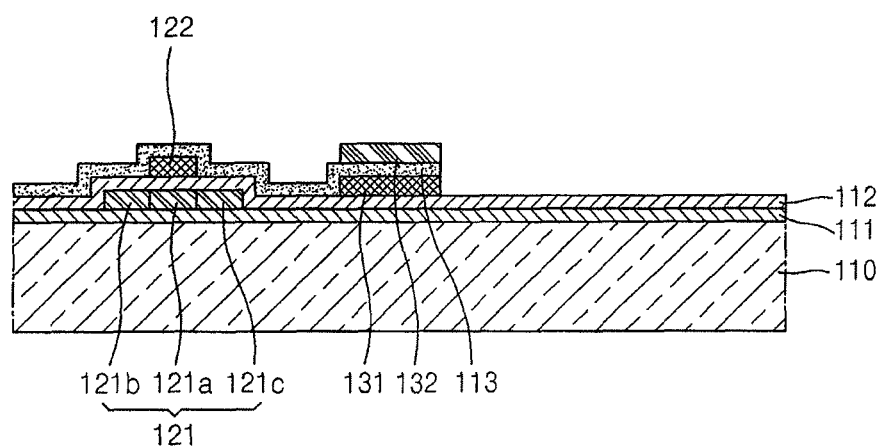

Referring to FIG. 8, when the metal layer 132M and the first insulating layer 113 are etched by using the photoresist PR11 and the photoresist PR12 of FIG. 7 as a mask, only the first insulating layer 113 remains on the gate electrode 122, the first insulating layer 113 and a second capacitor electrode 132 remain on the first capacitor electrode 131, and the first insulating layer 113 is not formed on the portion of the second insulating layer 112 in the light transmittance area TA. The first insulating layer 113 is formed on the remaining portion of the second insulating layer 112 in the device area DA as shown in FIG. 2.

Thus, by performing a half-tone mask process once, it is possible to form the first insulating layer 113 in the device area DA and not to form the first insulating layer 113 in the light transmittance area TA.

Here, since the second capacitor electrode 132 and the first insulating layer 113 are substantially simultaneously patterned by using the same photomask M, etched surfaces thereof are substantially the same.

Figure 9:
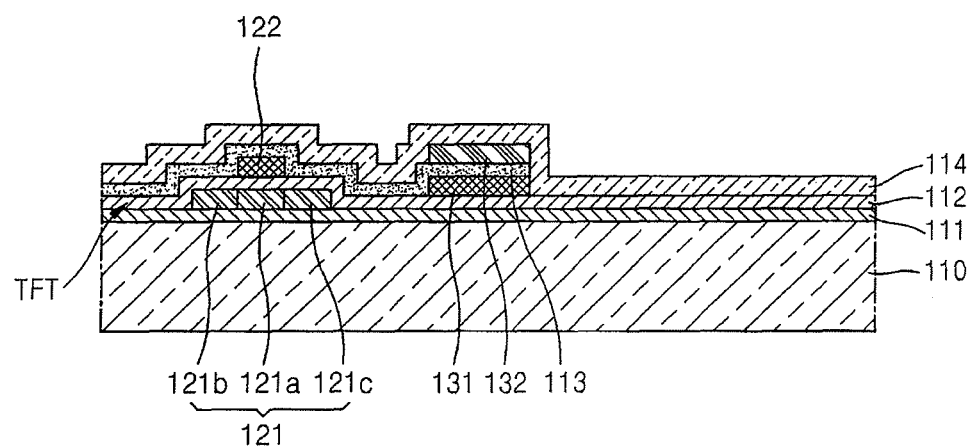

Referring to FIG. 9, a third insulating layer 114 is formed on the resultant structure of FIG. 8. In one embodiment, the third insulating layer 114 is formed at least partially of silicon oxide.

Figure 10:
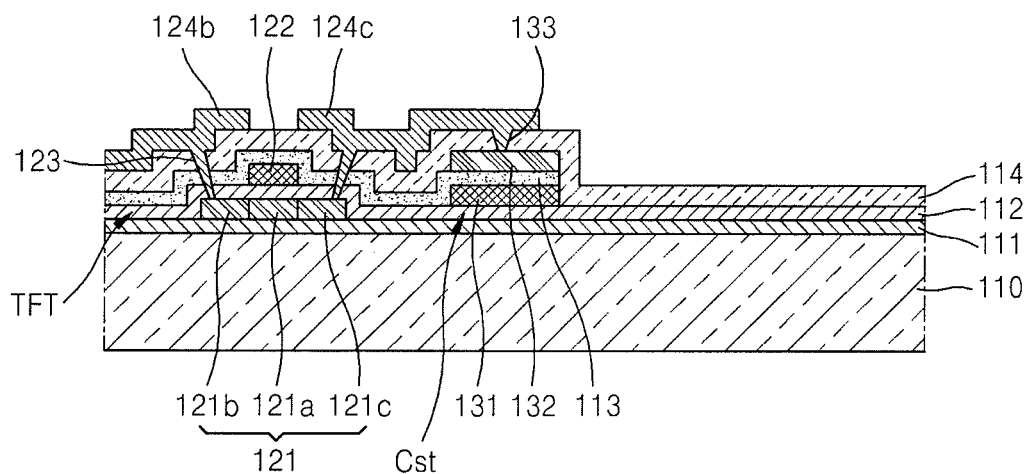

Referring to FIG. 10, a first contact hole 123 and a second contact hole 133 are formed in the resultant structure of FIG. 9, and then a source electrode 124b and a drain electrode 124c are formed. The source electrode 124b is electrically connected to a source region 121b via the first contact hole 123, and the drain electrode 124c is electrically connected to a drain region 121c and the second capacitor electrode 132 via the second contact hole 133. Although not illustrated in detail in FIG. 10, the first and second contact holes 123 and 133 may be formed by a photolithography method, and the source and drain electrodes 124b and 124c may also be formed by a photolithography method.

Figure 11:
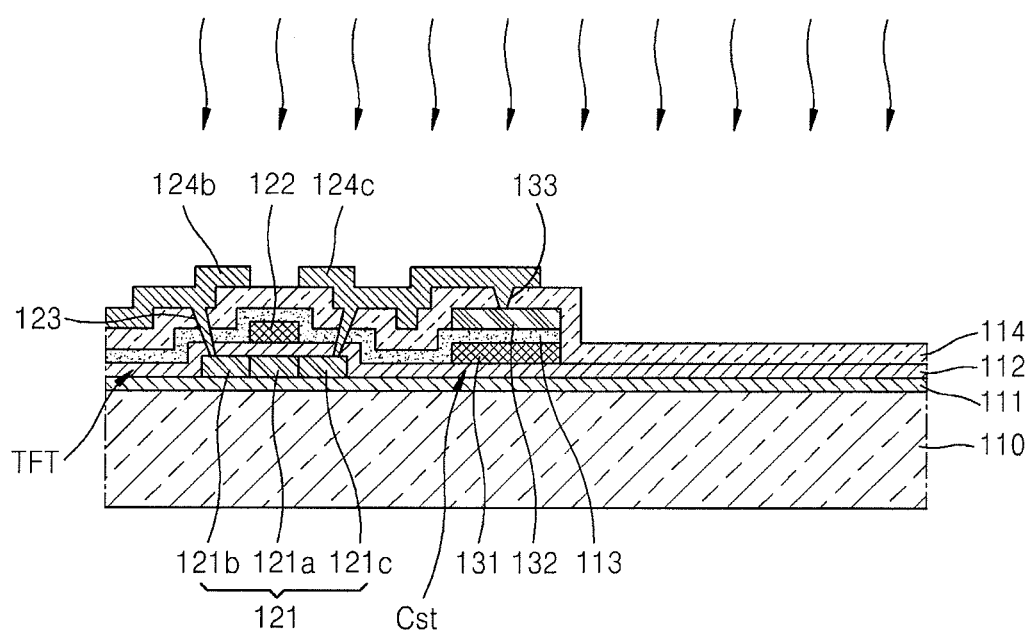

In one embodiment, as shown in FIG. 11, after the source and drain electrodes 124b and 124c of FIG. 10 are formed, a predetermined annealing process is performed. However, the present embodiment is not limited thereto, and thus, the annealing process may be formed any time after the first insulating layer 113 is formed and then an insulating layer such as the third insulating layer 114 for protecting the first insulating layer 113 is formed. Due to the annealing process, hydrogen that is supplied when silicon nitride is formed is stably diffused to the semiconductor layer 121.

Figure 13:
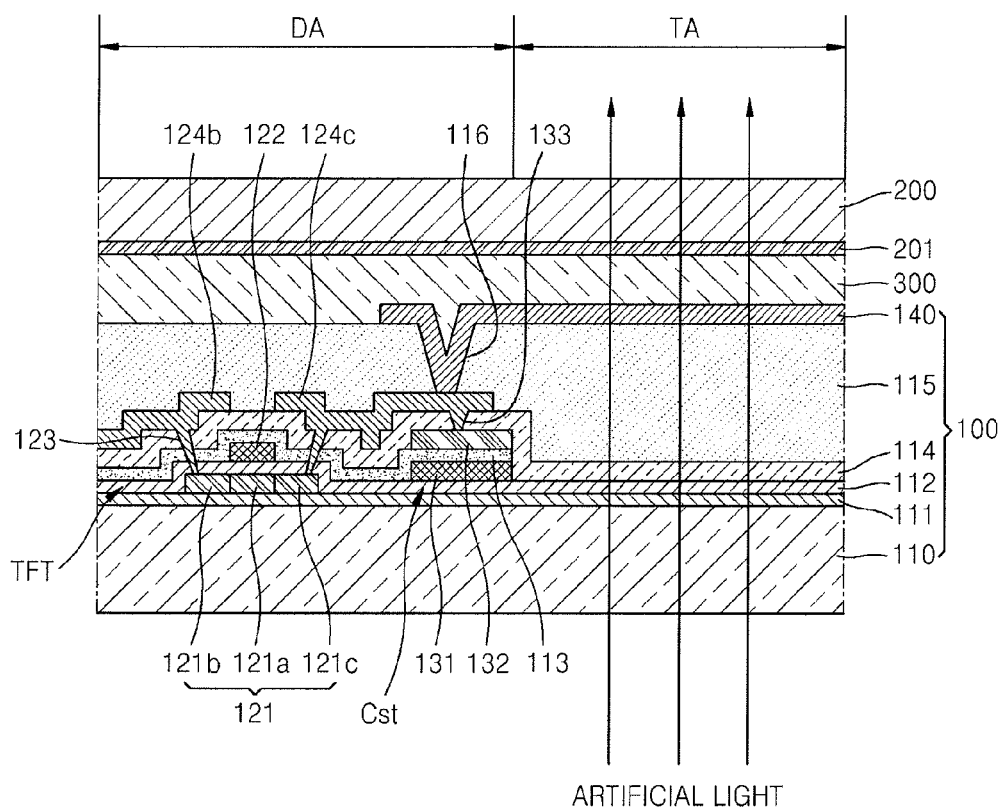
FIG. 13 is a cross-sectional view of a liquid crystal display (LCD) according to another embodiment.
Figure 14:
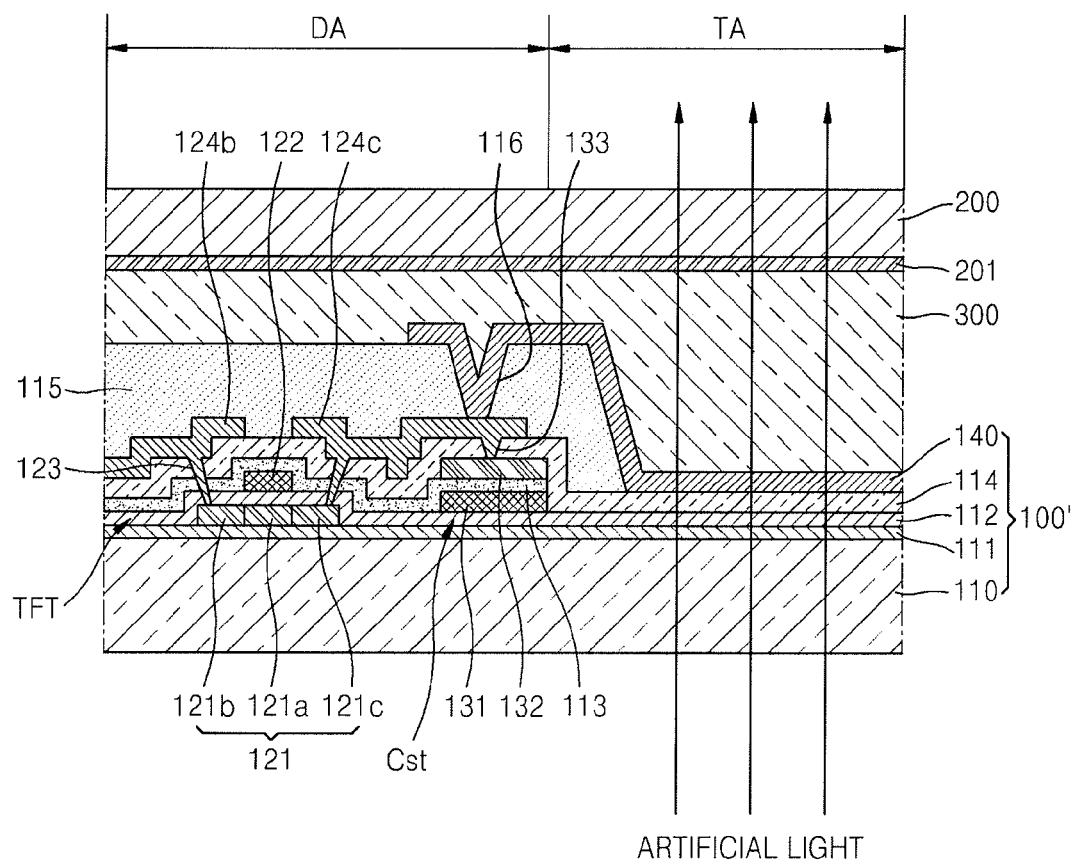
FIG. 14 is a cross-sectional view of a LCD according to another embodiment.

FIGS. 13 and 14 are cross-sectional views of LCDs respectively including the array substrates 100 and 100' of FIGS. 1 and 12, according to embodiments.

Referring to FIG. 13, the LCD includes the array substrate 100 of FIG. 1, an opposite substrate 200 having a common electrode 201 formed on a surface of the opposite substrate 200 facing the array substrate 100, and a liquid crystal layer 300 interposed between the array substrate 100 and the opposite substrate 200. The LCD displays an image by controlling transmittance of light by applying a voltage to the liquid crystal layer 300.

Meanwhile, although not illustrated in FIG. 13, the LCD may further include other components such as an alignment layer, a polarizing plate, a color filter, or the like.

In the LCD according to the present embodiment, a light transmittance area TA functions as a light-transmitting window so that artificial or ambient light may pass therethrough via the array substrate 100 and the opposite substrate 200. In this embodiment, the common electrode 201 and the transparent electrode 140 are formed at least partially of a transparent material. Also, since the first insulating layer 113 is not formed in the light transmittance area TA of the array substrate 100, it is possible to prevent transmittance degrading which can be caused by the difference between refractive indexes of inorganic insulating layers. The organic insulating layer 115 may also be formed at least partially of a transparent material. As shown in the LCD of FIG. 14, the organic insulating layer 115 may not be formed in the light transmittance area TA, and thus it is not necessary to form the organic insulating layer 115 by using the transparent material.

Meanwhile, the embodiments of FIGS. 13 and 14 are directed to an LCD but are not limited thereto, and thus may be applied to various types of displays, for example, a bottom emission-type organic light emitting display in which an image is displayed via a base substrate 110.

Figure 15:
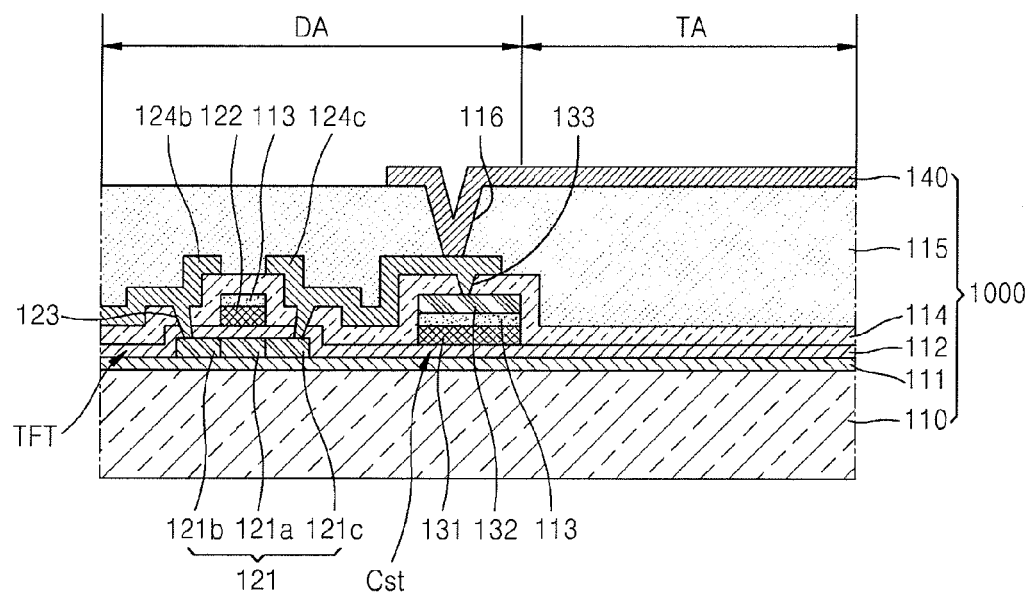
FIG. 15 is a cross-sectional view of an array substrate according to another embodiment.

FIG. 15 is a cross-sectional view of an array substrate 1000 according to another embodiment. FIGS. 16 through 19 are cross-sectional views for partially illustrating a method of manufacturing the array substrate 1000. Hereinafter, the array substrate 1000 will be described in terms of features different from those of the array substrate 100. Like reference numerals in the drawings denote like elements.

Referring to FIG. 15, the array substrate 1000 includes a device area DA (or a non-light transmittance area) in which a TFT and a capacitor Cst are formed, and a light transmittance area TA in which a transparent electrode 140 is formed.

Like in the previous embodiment, a first insulating layer 113 formed at least partially of silicon nitride is formed on a gate electrode 122 of the TFT, so that electron mobility of the TFT is increased. Also the first insulating layer 113 that is formed at least partially of silicon nitride is formed as a dielectric layer of the capacitor Cst, so that the capacitance of the capacitor Cst is increased, and the first insulating layer 113 is not formed in the light transmittance area TA, so that light transmittance may be increased.

In the array substrate 100 according to the previous embodiment (See FIGS. 1 and 13), the first insulating layer 113 substantially completely covers the gate electrode 122 of the TFT and is formed on an area corresponding to a top portion of the semiconductor layer 121. However, the first insulating layer 113 of the array substrate 1000 according to the present embodiment is formed only on the gate electrode 122. The difference thereof is due to different methods of manufacturing an array substrate.

Figure 20:
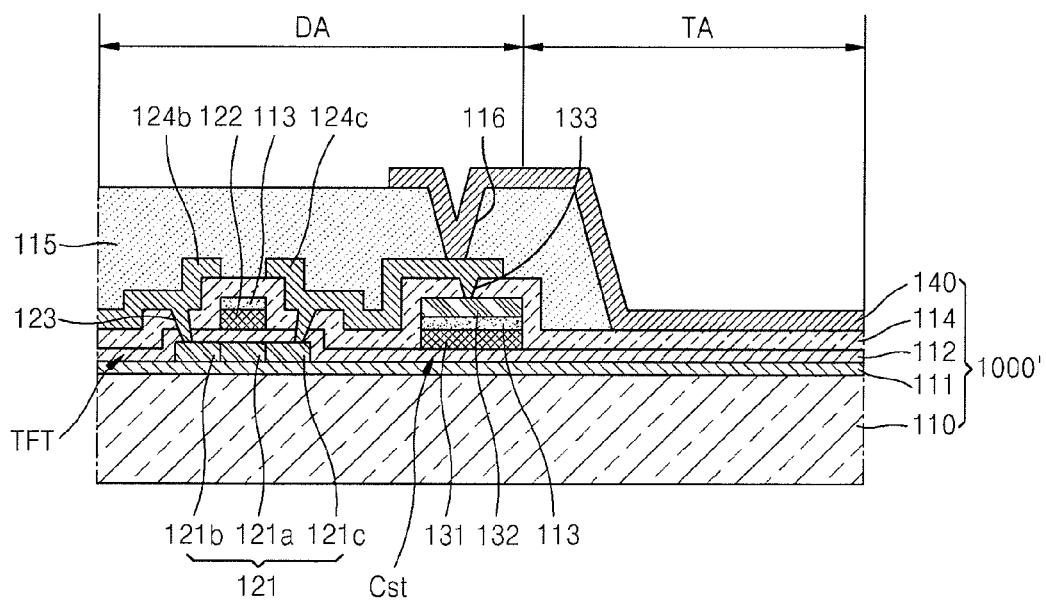
FIG. 20 is a cross-sectional view of an array substrate according to another embodiment.

Referring to FIG. 20, an array substrate 1000' according to another embodiment may not include an organic insulating layer 115 in the light transmittance area TA. In this case, it is not necessary to form the organic insulating layer 115 by using a transparent material. Thus, according to the array substrate 1000' of FIG. 20, light transmittance of the light transmittance area TA may be increased by omitting the organic insulating layer 115 in the light transmittance area TA.

Hereinafter, a method of manufacturing the array substrate 1000 of FIG. 15 will be described with reference to FIGS. 16 through 19. Operations omitted here may be the same ones as those of manufacturing the array substrate 100 of FIG. 1.

Figure 16:
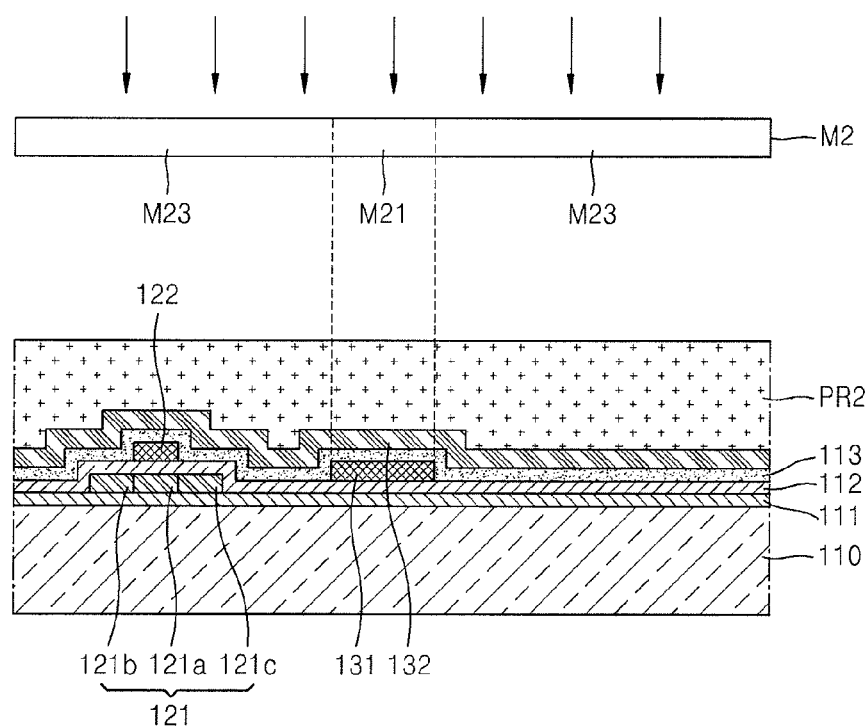
FIGS. 16 through 19 are cross-sectional views for partially illustrating a procedure for manufacturing the array substrate of FIG. 15.

Referring to FIG. 16, as described with reference to FIG. 6, the first insulating layer 113 and a metal layer 132M (not shown) are sequentially stacked in the order stated on a structure in which a buffer layer 111, the semiconductor layer 121, a second insulating layer 112, the gate electrode 122, and a first capacitor electrode 131 are formed on a base substrate 110 in the order stated, and then a photoresist PR2 is coated thereon.

Unlike the previous embodiment, a half-tone mask is not used as a photomask M2.

The photomask M2 according to the present embodiment includes an opaque portion M21 and a transmissive portion M23. The opaque portion M21 is formed to correspond to or substantially directly above a capacitor Cst, and the transmissive portion M23 is formed to correspond to or substantially directly above a light transmittance area TA.

Although not illustrated in detail in FIG. 16, the photoresist PR2 is exposed by using the photomask M2, and then developing, etching and stripping processes are sequentially performed so that a pattern for a second capacitor electrode 132 is formed on the first insulating layer 113.

Figure 17:
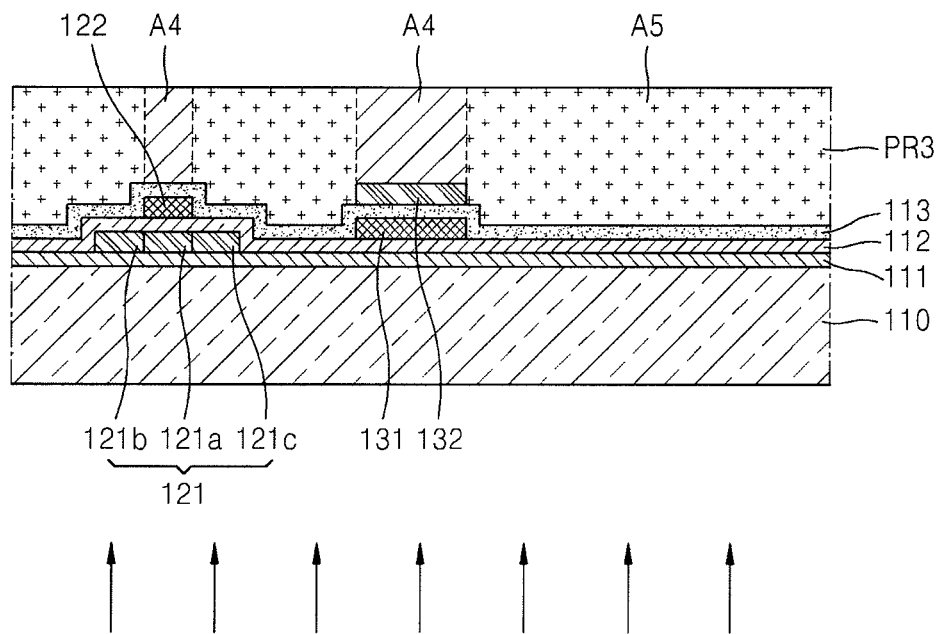

Referring to FIG. 17, a photoresist PR3 is coated on the resultant structure of FIG. 16, and back exposure is performed from the base substrate 110 toward the photoresist PR3. Here, the gate electrode 122 and the first capacitor electrode 131 function as blocking masks, so that the photoresist PR3 is divided into areas A4 in which the gate electrode 122 and the first capacitor electrode 131 are formed, respectively, and an area A5 in which the gate electrode 122 and the first capacitor electrode 131 are not formed.

Figure 18:
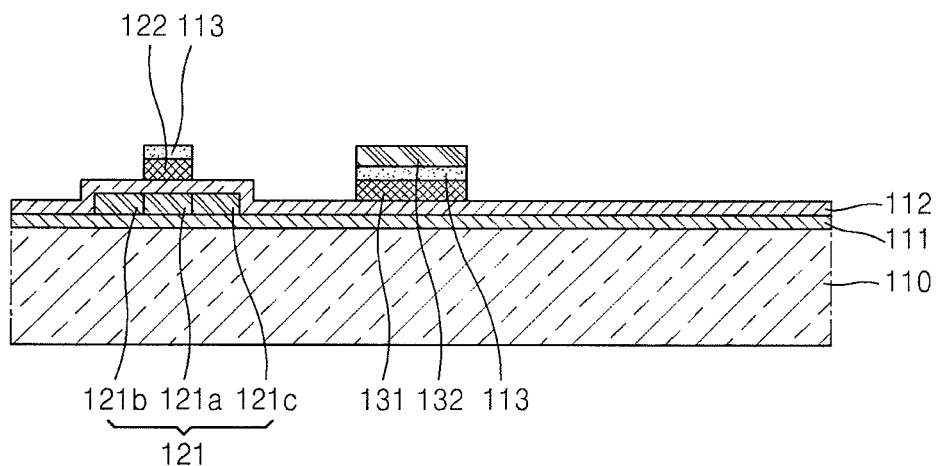

Referring to FIGS. 17 and 18, after the developing, etching and stripping processes are sequentially performed, the first insulating layer 113 of the areas A4 in which the gate electrode 122 and the first capacitor electrode 131 are formed remains, and the first insulating layer 113 of the area A5 including the light transmittance area TA in which the gate electrode 122 and the first capacitor electrode 131 are not formed is removed.

Since the patterning operation is performed by using the gate electrode 122 as a blocking mask, etched surfaces of the gate electrode 122 and the first insulating layer 113 are substantially equal to each other. Also, since the first capacitor electrode 131 is used as a blocking mask, etched surfaces of the first capacitor electrode 131 and the first insulating layer 113 are substantially equal to each other.

According to the previous embodiment, by using the half-tone mask, the first insulating layer 113 is formed only in the device area DA, and the first insulating layer 113 in the light transmittance area TA is removed. However, according to the present embodiment, it is not necessary to use an expensive half-tone mask to obtain the same effect by using a general inexpensive photomask and the back exposure.

Figure 19:
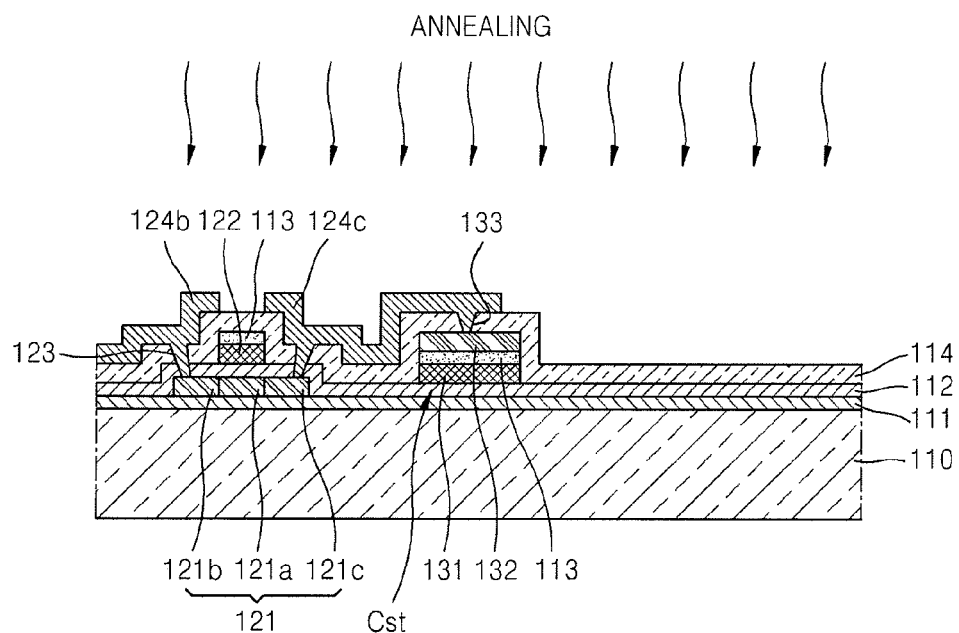

Referring to FIG. 19, a third insulating layer 114, a first contact hole 123, and a second contact hole 133 are formed on the resultant structure of FIG. 18, and a source electrode 124b and a drain electrode 124c are formed. The source electrode 124b is electrically connected to a source region 121b via the first contact hole 123, and the drain electrode 124c is electrically connected to a drain region 121c and the second capacitor electrode 132 via the second contact hole 133. After the source electrode 124b and the drain electrode 124c are formed, an annealing process is performed. Due to the annealing process, hydrogen that is supplied when silicon nitride is formed is stably diffused to the semiconductor layer 121.

Figure 21:
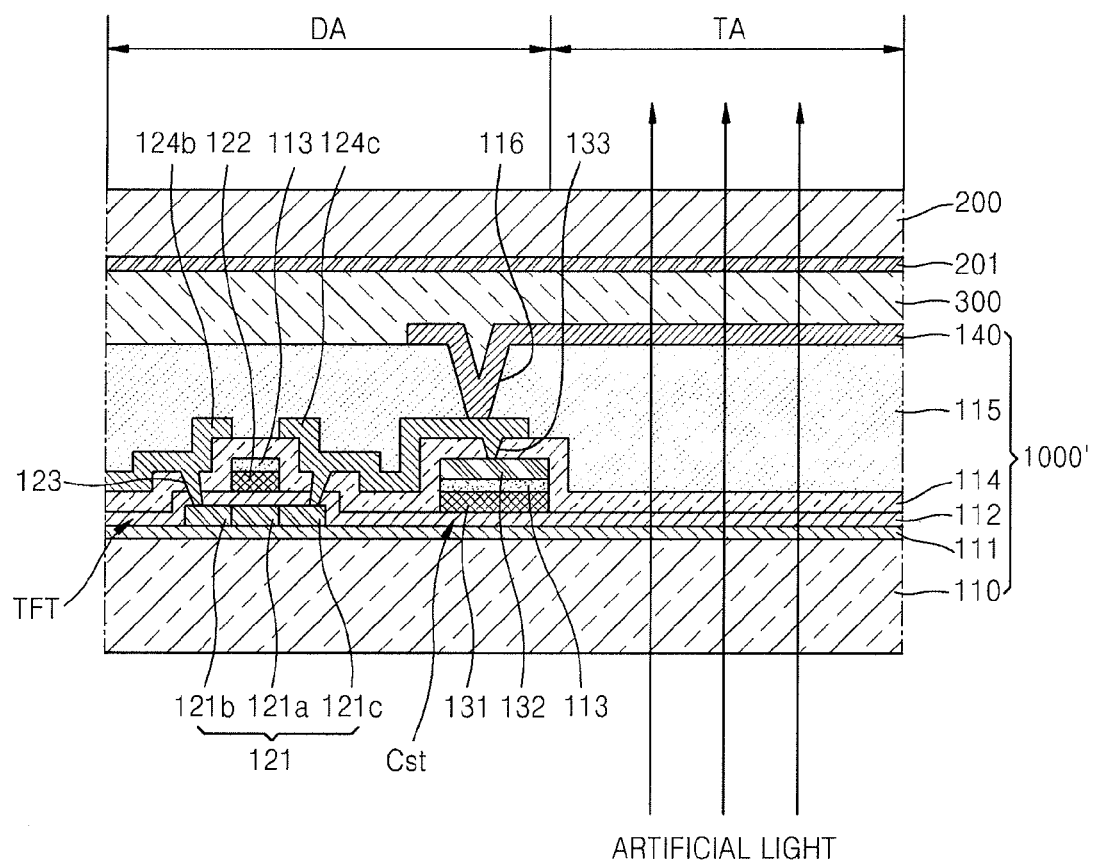
FIG. 21 is a cross-sectional view of a LCD according to another embodiment.
Figure 22:
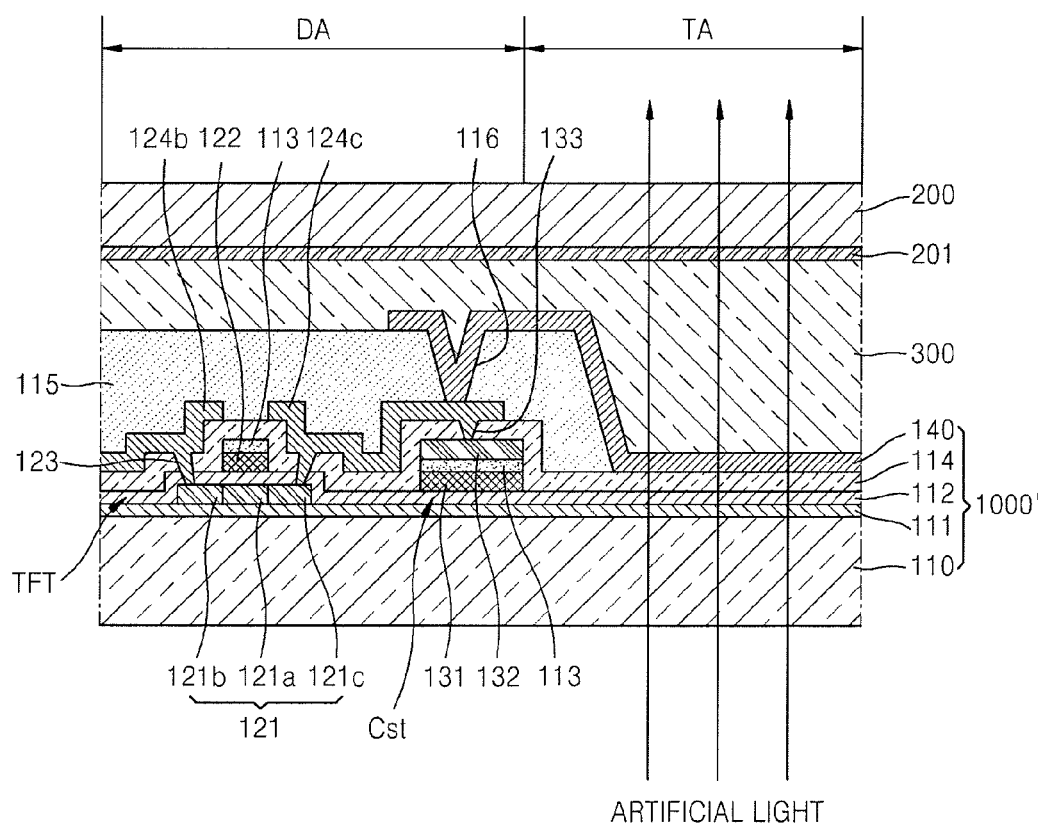
FIG. 22 is a cross-sectional view of a LCD according to another embodiment.

FIGS. 21 and 22 are cross-sectional views of LCDs including the array substrates 1000 and 1000' of FIGS. 15 and 20 according to embodiments.

Referring to FIG. 21, the LCD includes the array substrate 1000 of FIG. 15, an opposite substrate 200 having a common electrode 201 formed on a surface of the opposite substrate 200 facing the array substrate 1000, and a liquid crystal layer 300 interposed between the array substrate 1000 and the opposite substrate 200. The LCD displays an image by controlling transmittance of light by applying a voltage to the liquid crystal layer 300.

Meanwhile, although not illustrated in FIG. 21, the LCD may further include other components such as an alignment layer, a polarizing plate, a color filter, or the like.

In the LCD according to the present embodiment, a light transmittance area TA functions as a light-transmitting window so that artificial or ambient light may pass through the array substrate 1000 and the opposite substrate 200. In this embodiment, the common electrode 201 and the transparent electrode 140 are formed at least partially of a transparent material. Also, since the first insulating layer 113 is not formed in the light transmittance area TA of the array substrate 1000, it is possible to prevent transmittance degrading which can be caused by the difference between refractive indexes of inorganic insulating layers. The organic insulating layer 115 may also be formed at least partially of a transparent material. As shown in the LCD of FIG. 22, the organic insulating layer 115 may not be formed in the light transmittance area TA, and thus it is not necessary to form the organic insulating layer 115 by using the transparent material.

The array substrate, the method of manufacturing the array substrate, and the display apparatus including the array substrate according to at least one of the disclosed embodiments provide the following benefits.

First, silicon nitride having a larger dielectric constant than silicon oxide is used as the dielectric layer of the capacitor so that the capacitance of the capacitor is increased.

Second, silicon nitride formed in a hydrogen atmosphere is used as the interlayer insulating layers of the TFT and the dielectric layer of the capacitor so that device characteristics of the TFT and the capacitor is increased.

Third, silicon nitride having a refractive index different from that of silicon oxide is removed from the light transmittance area so that the transmittance of the light-transmitting window is increased.

Fourth, by using the half-tone mask, silicon nitride may be simply removed from the light transmittance area.

Fifth, by using the general photomask and the back exposure, silicon nitride may be removed from the light transmittance area at low costs.

Meanwhile, components illustrated in the drawings may be exaggerated or reduced for convenience of description, and thus the embodiments are not limited to sizes or forms of the components in the drawings.

While the disclosed embodiments have been particularly shown and described with reference to the accompanying drawings, it will be understood by those of ordinary skill in the art that various changes in form and details may be made therein without departing from the spirit and scope of the following claims.

What is claimed is:

1. An array substrate comprising:
a transistor area in which a transistor is formed;
a capacitor area in which a capacitor is formed, wherein the capacitor is electrically connected to the transistor;
a light transmittance area adjacent to at least one of the transistor area and the capacitor area;
a first insulating layer formed in at least one of the transistor area and the capacitor area, wherein the first insulating layer is not formed in the light transmittance area, and wherein the first insulating layer is formed at least in the capacitor area, and is used as a dielectric layer of the capacitor; and
a second insulating layer having i) a first portion arranged to substantially overlap with the first insulating layer in the at least one area, and ii) a second portion formed in the light transmittance area,
wherein the first insulating layer has substantially the same etched surface as at least one electrode of the capacitor.

2. An array substrate comprising:
a transistor area in which a transistor is formed;
a capacitor area in which a capacitor is formed, wherein the capacitor is electrically connected to the transistor;
a light transmittance area adjacent to at least one of the transistor area and the capacitor area;

a first insulating layer formed in at least one of the transistor area and the capacitor area, wherein the first insulating layer is not formed in the light transmittance area; and a second insulating layer having i) a first portion arranged to substantially overlap with the first insulating layer in the at least one area, and ii) a second portion formed in the light transmittance area, wherein the first insulating layer has a first amount of hydrogen, and the second insulating layer has a second amount of hydrogen that is less than the first amount, wherein the first insulating layer comprises a first material having a first light transmittance, wherein the second insulating layer comprises a second material having a second light transmittance that is different from the first light transmittance, and wherein the first light transmittance is less than the second light transmittance.

3. The array substrate of claim 2, wherein the first material is formed at least partially of silicon nitride, and wherein the second material is formed at least partially of silicon oxide.

4. The array substrate of claim 3, wherein the first insulating layer contains hydrogen.

5. The array substrate of claim 4, wherein the first insulating layer is formed at least in the transistor area,
    wherein at least one of an active layer and a gate electrode of the transistor comprises polysilicon, and
    wherein the hydrogen contained in the first insulating layer is configured to fill a defective region of the polysilicon.

6. The array substrate of claim 4, wherein the first insulating layer is formed at least in the capacitor area,
    wherein at least one of electrodes of the capacitor comprises polysilicon, and
    wherein the hydrogen contained in the first insulating layer is configured to fill a defective region of the polysilicon.

7. The array substrate of claim 2, further comprising a third insulating layer formed on the first insulating layer, wherein the third insulating layer comprises the second amount of hydrogen and the second material.

8. The array substrate of claim 7, wherein the third insulating layer comprises i) a first portion formed between the first insulating layer and source and drain electrodes of the transistor and ii) a second portion formed on the capacitor.

9. The array substrate of claim 1, wherein the first insulating layer is formed between lower and upper electrodes of the capacitor, and formed on a gate electrode of the transistor.

10. The array substrate of claim 9, wherein the first portion of the second insulating layer is used as a gate-insulating layer of the transistor.

11. The array substrate of claim 9, wherein the first insulating layer has substantially the same etched surface as the gate electrode.

12. The array substrate of claim 1, further comprising a transparent electrode electrically connected to one of source and drain electrodes of the transistor, and formed in the light transmittance area.

13. The array substrate of claim 12, further comprising a third insulating layer formed on the second insulating layer.

14. The array substrate of claim 12, further comprising an organic insulating layer formed between the transparent electrode and the source and drain electrodes of the transistor.

15. The array substrate of claim 14, wherein the organic insulating layer is not formed in the light transmittance area.

16. An array substrate comprising:
    a non-light transmittance area in which a capacitor and a transistor, electrically connected to each other, are formed;
    a light transmittance area adjacent to the non-light transmittance area;
    a first insulating layer formed only in the non-light transmittance area, wherein the first insulating layer is formed at least in the capacitor, and is used as a dielectric layer of the capacitor;
    a second insulating layer having a first portion arranged to substantially overlap with the first insulating layer, and a second portion formed in the light transmittance area;
    a transparent electrode electrically connected to one of source and drain electrodes of the transistor, and formed in the light transmittance area;
    a common electrode facing the transparent electrode; and
    a light-emitting device formed between the transparent electrode and common electrode,
    wherein the first insulating layer has a first amount of hydrogen, and the second insulating layer has a second amount of hydrogen that is less than the first amount,
    wherein the first insulating layer comprises a material having a first light transmittance, and the second insulating layer comprises a material having a second light transmittance that is different from the first light transmittance, and
    wherein the light-emitting device comprises liquid crystal.

* * * * *